United States Patent
Sie et al.

(10) Patent No.: US 9,806,725 B2
(45) Date of Patent: Oct. 31, 2017

(54) PHASE LOCK LOOP

(71) Applicant: MEDIATEK Inc., Hsin-Chu (TW)

(72) Inventors: Yi-Jhan Sie, Taichung (TW); Po-Min Wang, Yunlin County (TW); Chih-Hong Lou, Yilan County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/133,369

(22) Filed: Apr. 20, 2016

(65) Prior Publication Data

US 2017/0063385 A1    Mar. 2, 2017

Related U.S. Application Data

(60) Provisional application No. 62/210,082, filed on Aug. 26, 2015.

(51) Int. Cl.
*H03L 7/093* (2006.01)
*H03L 7/099* (2006.01)

(52) U.S. Cl.
CPC .............. *H03L 7/093* (2013.01); *H03L 7/099* (2013.01)

(58) Field of Classification Search
CPC ..... H03L 7/093; H03L 7/0991; H03L 7/0993; H03L 7/0994
See application file for complete search history.

(56) References Cited

U.S. PATENT DOCUMENTS

| 7,307,560 | B2* | 12/2007 | Shi | G01R 31/31727 341/118 |
| 7,548,123 | B2* | 6/2009 | Frey | H03L 7/0802 331/1 A |
| 8,076,978 | B2* | 12/2011 | Da Dalt | H03L 7/16 331/1 A |
| 9,246,500 | B2* | 1/2016 | Perrott | H03L 7/093 |
| 9,319,051 | B2* | 4/2016 | Syllaios | H03L 7/093 |
| 9,461,657 | B2* | 10/2016 | Galton | H03L 7/197 |

(Continued)

OTHER PUBLICATIONS

Venerus, et al.: "Delta-Sigma FDC Based Fractional-PLLs"; IEEE Transactions on Circuits and Systems—I: Regular Papers, vol. 60, No. 5, May 2013; pp. 1274-1285.

(Continued)

*Primary Examiner* — Thomas J Hiltunen
(74) *Attorney, Agent, or Firm* — McClure, Qualey & Rodack, LLP

(57) ABSTRACT

A PLL includes a phase frequency detector (PFD), a charge pump, a capacitor coupled to the charge pump, an analog-to-digital convertor (ADC), a noise canceller, an accumulator, a loop filter, an oscillator, a digital block and a frequency divider. The PFD detects a phase difference between a reference signal and a divided signal. The charge pump generates a charge pump signal in response to the phase difference. The ADC converts the charge pump signal to a first digital signal, and quantizes it to a second digital signal. The noise canceller forms a shaped noise signal according to the first and second digital signals, and eliminates the shaped noise signal at the output of the noise canceller to generate a noise cancelled signal. The accumulator accumulates the noise cancelled signal. The loop filter filters the accumulated signal. The oscillator provides an output oscillating signal in response to the filtered signal.

19 Claims, 6 Drawing Sheets

(56) References Cited

U.S. PATENT DOCUMENTS

| | | | | |
|---|---|---|---|---|
| 2013/0113528 A1* | 5/2013 | Frantzeskakis | ........... | H03L 7/10 327/117 |
| 2013/0257494 A1* | 10/2013 | Nikaeen | ................ | H03M 3/458 327/156 |
| 2016/0065224 A1* | 3/2016 | Galton | .................... | H03L 7/093 327/157 |

OTHER PUBLICATIONS

Venerus, et al.: "A TDC-Free Mostly-Digital FDC-PLL Frequency Synthesizer With a 2.8-3.5 GHz DCO"; IEEE Journal of Solid-State Circuits, vol. 50, No. 2, Feb. 2015; pp. 450-463.

\* cited by examiner

PHASE LOCK LOOP

This application claims the benefit of U.S. provisional application Ser. No. 62/210,082, filed Aug. 26, 2015, the disclosure of which is incorporated by reference herein in its entirety.

TECHNICAL FIELD

The disclosure relates in general to a phase lock loop (PLL

BACKGROUND

Frequency-to-digital converter (FDC) based PLLs are widely used n wireless communication systems because they provide many of the advantage of both analog and digital PLLs. However, the circuit design of FDC based PLL faces a trade off between noise suppression and bandwidth extension. For example, when a high resolution ADC is employed to suppress the quantization noise component of the PLL's phase noise, the bandwidth of the PLL becomes narrow and hard to be used in intermediate frequency (IF) application.

Therefore, there is a need to provide a PLL capable of suppressing the quantization noise and extending the bandwidth.

SUMMARY

The disclosure is directed to a PLL with a noise canceller. The proposed PLL not only suppress the quantization noise component of the PLL's phase noise effectively, but also extends the operation bandwidth.

According to one embodiment, a PLL is provided. The PLL includes a phase frequency detector (PFD), a charge pump, a capacitor coupled to the charge pump, an analog-to-digital convertor (ADO), a noise canceller, an accumulator, a loop filter, an oscillator, a digital block and a frequency divider. The PFD is for detecting a phase difference between a reference signal and a divided signal. The charge pump, coupled to the PFD, is for providing a charge pump signal. The capacitor is coupled to the charge pump. The ADC, coupled to the capacitor, is for converting the charge pump signal to a first digital signal, and quantizing the first digital signal to a second digital signal. The noise canceller, coupled to the ADO, is for forming a shaped noise signal according to the first and second digital signals, and eliminating the shaped noise signal at the output of the noise canceller to generate a noise cancelled signal. The accumulator, coupled to the noise canceller, is for accumulating the noise cancelled signal to output an accumulated signal. The loop filter, coupled to the accumulator, is for outputting a filtered signal in response to the accumulated signal. The oscillator, coupled to the loop filter, is for providing an output oscillating signal in response to the filtered signal. The digital block, coupled to the ADC, is for converting the second digital signal to a divider modulus control signal. The frequency divider, coupled to the oscillator and the digital block, is for dividing the frequency of the output oscillating signal according to the divider modulus control signal to generate the divided signal.

According to another embodiment, a PLL is provided. The PLL includes a PFD, a charge pump, a capacitor, an ADC, a noise canceller, an accumulator, a loop filter, an oscillator and a frequency divider. The PFD is for detecting a phase difference between a reference signal and a divided signal. The charge pump, coupled to the PFD, is for providing a charge pump signal. The capacitor is coupled to the charge pump, wherein the voltage on the capacitor resets to an initial value every operating cycle in response to a reset signal. The ADC, coupled to the capacitor, is for converting the charge pump signal to a first digital signal, and quantizing the first digital signal to a second digital signal. The noise canceller, coupled to the ADC, is for forming a shaped noise signal according to the first and second digital signals, and eliminating the shaped noise signal at the output of the noise canceller to generate a noise cancelled signal. The accumulator, coupled to the noise canceller, is for accumulating the noise cancelled signal to output an accumulated signal. The loop filter, coupled to the accumulator, is for outputting a filtered signal in response to the accumulated signal. The oscillator, coupled to the loop filter, is for providing an output oscillating signal in response to the filtered signal. The digital block, coupled to the ADC, is for converting the second digital signal to a divider modulus control signal with a z-domain transfer function of 1. The frequency divider, coupled to the oscillator and the digital block, is for dividing the frequency of the output oscillating signal according to the divider modulus control signal to generate the divided signal.

Figure 1:
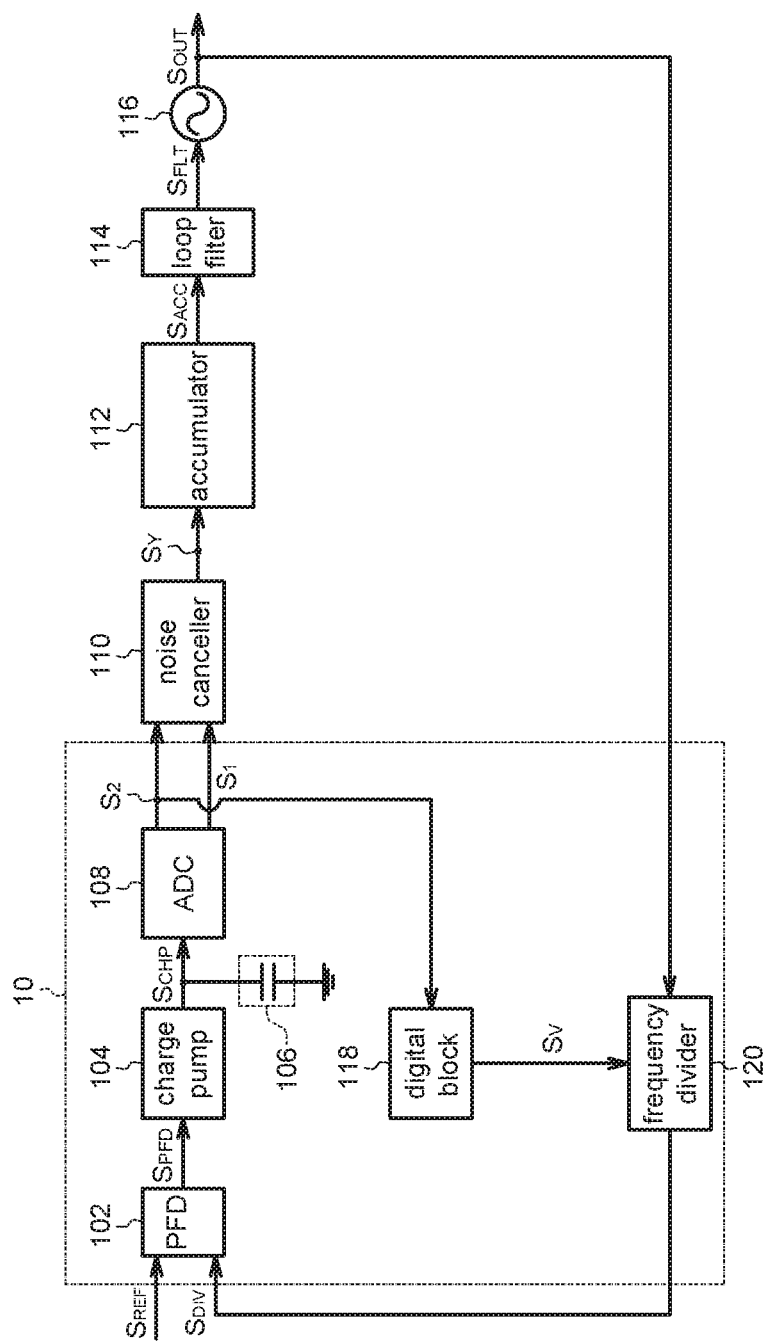
FIG. 1 shows a simplified block diagram of a PLL according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a simplified block diagram of a phase frequency detector (PFD) 100 according to an embodiment of the present invention. The PLL 100 includes a phase frequency detector (PFD) 102, a charge pump 104, a capacitor 106 coupled to the charge pump 104, an analog-to-digital convertor (ADC) 108, a noise canceller 110, an accumulator 112, a loop filter 114, an oscillator 116, a digital block 118 and a frequency divider 120. The PLL 100 can be a frequency-to-digital converter (FDC) based PLL. The FDC part of the PLL is denoted as block 10 in the figure, which includes the PFD 102, the charge pump 104, the capacitor 106, the ADC 108, the digital block 118 and the frequency divider 120.

The PFD 102 detects a phase difference $S_{PFD}$ between a reference signal $S_{REF}$ and a divided signal $S_{DIV}$. The charge pump 104, coupled to the phase frequency detector 102, provides a charge pump signal $S_{CHP}$ in response to the phase difference $S_{PFD}$. The ADC 108, coupled to the capacitor 106, converts the charge pump signal $S_{PFD}$ to a first digital signal $S_1$, and quantizes the first digital signal $S_1$ to a second digital signal $S_2$.

The noise canceller 110, coupled to the ADC, extracts a shaped noise signal according to the first and second digital signals $S_1$ and $S_2$, and eliminates the shaped noise signal at the output of the noise canceller 110 to generate a noise cancelled signal $S_Y$. In one embodiment, the noise canceller 110 may perform noise shaping to a difference between the second digital signal $S_2$ and a scaled first digital signal to obtain the shaped noise signal.

The accumulator 112 may accumulate the noise cancelled signal $S_Y$ and passes the result to the loop filter 114. As shown in FIG. 1, the accumulator 112, coupled to the noise canceller 110, may accumulate the noise cancelled signal $S_Y$ to output an accumulated signal $S_{ACC}$. The loop filter 114, coupled to the accumulator 112, then outputs a filtered signal $S_{FLT}$ in response to the accumulated signal $S_{ACC}$. The oscillator 116, coupled to the loop filter 114, may provide an output oscillating signal $S_{OUT}$ in response to the filtered signal $S_{FLT}$. The oscillator 116 can be, for example, a digitally controlled oscillator (DCO).

The digital block 118, coupled to the ADC 108, converts the second digital signal $S_2$ to a divider modulus control signal $S_V$. The frequency divider 120, coupled to the oscillator 116 and the digital block 118, divides the frequency of the output oscillating signal $S_V$ according to the divider modulus control signal $S_V$ to generate the divided signal $S_{DIV}$. For a $2^{nd}$ order FDC PLL structure, the digital block 118 can be implemented by a digital circuit whose z-domain transfer function is $2-z^{-1}$, where z is a complex number. Given that the $i^{th}$ ADC sample for the second digital signal $S_2$ is $S_2[i]$ and the corresponding value of the divider modulus control signal $S_V$ is $S_V[i]$, the $i^{th}$ divider modulus of the frequency divider 120 is $N-S_V[i]$, where N is an integer, and $S_V[i]=2S_2[i]-S_2[i-1]$.

Figure 2:
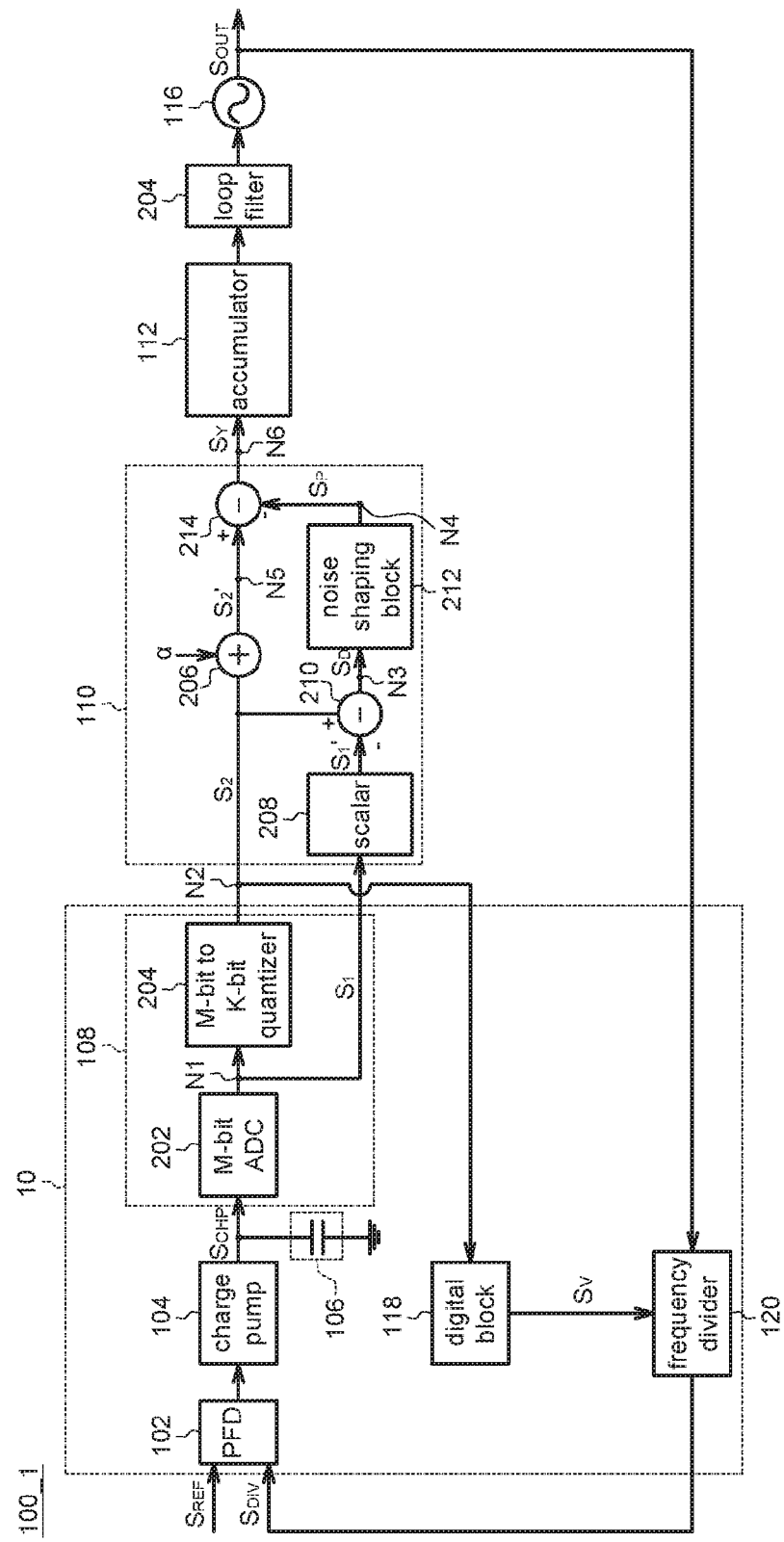
FIG. 2 shows a block diagram of a PLL according to an embodiment of the present invention.

FIG. 2 shows a block diagram of a PLL 100_1 according to an embodiment of the present invention. The illustrated PLL 100_1 is an example of the PLL 100 shown in FIG. 1, which is intended to exemplify, but not to limit, the present invention.

The ADC 108 includes an M-bit ADC 202 and an M-bit to K-bit quantizer 204, where K and M are integers and K is less than or equal to M. The M-bit ADC 202 may covert the charge pump signal $S_{CHP}$ to the first digital signal $S_1$ with a resolution of M-bit. Then, the M-bit to K-bit quantizer 204, coupled to the M-bit ADC 202, may quantize the first digital signal $S_1$ to the second digital signal $S_2$ with a resolution of K-bit. Accordingly, the first digital signal $S_1$ can be regarded as a digital signal with M-bit resolution, and the second digital signal $S_2$ can be regarded as another digital signal with K-bit resolution. The M-bit to K-bit quantizer 204 can be a delta-sigma modulator (DSM) or a truncater.

In general, the noise introduced by the FDC 10 is mainly contributed by the quantization noise of the ADC 108. It is known that the higher resolution of the ADC 108 may lower the quantization noise. However, in order to meet the range limitation of the divider modulus of the frequency divider 120, the ADC 108 needs to provide a lower resolution output, e.g., the second digital signal $S_2$, to effectively adjust the divider modulus, and this means that the quantization noise of the ADC 108 will be significantly increased. To address this issue, the ADC 108 may employ a high resolution ADC, e.g., the M-bit ADC 202, to suppress the quantization noise, and utilizes a low resolution quantizer, e.g., the M-bit to K-bit quantizer 204, to provide the lower resolution output for the frequency divider 120. Even though the quantization noise introduced by the low resolution quantizer, e.g., the M-bit to K-bit quantizer 204, may be significant, it can be cancelled by the noise canceller 110. Thus, the quantization noise component of the PLL 100_1's phase noise can be significantly reduced, and the bandwidth of the PLL 100_1 can then be widened.

The noise canceller 110 includes an adder 206, a scalar 208, a first subtractor 210, a noise shaping block 212 and a second subtractor 214. The adder 206, coupled to the ADC 108, may add a frequency control parameter $\alpha$ into the second digital signal $S_2$ to generate an added signal $S_2'$, wherein the frequency control parameter $\alpha$ is corresponding to the fractional part of the frequency multiplication of the output oscillating signal $S_{OUT}$. For example, given that the frequency of the reference signal $S_{REF}$ is $F_{REF}$, then the frequency of the output oscillating signal $S_{OUT}$ can be expressed as follows:

$$F_{OUT}=(N+\alpha)F_{REF}, \quad (eq1)$$

where $F_{OUT}$ is the frequency of the output oscillating signal $S_{OUT}$, $(N+\alpha)$ is the frequency multiplication of the output oscillating signal $S_{OUT}$, and N and $\alpha$ are integral and fractional parts of the frequency multiplication, respectively.

The scalar 208, coupled to the ADO 108, may scale the first digital signal $S_1$ to generate the scaled first digital signal $S_1'$. In one embodiment, the scaled first digital signal $S_1'$ can be obtained by scaling the first digital signal $S_1$ by a ratio of $\Delta_1/\Delta_2$, wherein $\Delta_1$ is the step size of the M-bit ADC 202, and $\Delta_2$ is the step size of the M-bit to K-bit quantizer 204.

The first subtractor 210, coupled to the scalar 208 and the ADC 108, may subtract the scaled first digital signal $S_1'$ from the second digital signal $S_2$ to generate a difference signal $S_D$.

The difference signal $S_D$ can be deemed as the quantization error introduced by the M-bit to K-bit quantizer 204. Thus, any circuit/structure capable of extracting the quantization error of the M-bit to K-bit quantizer 204 is applicable for the obtaining of the difference signal $S_D$. For example, if the M-bit to K-bit quantizer 204 is a M-bit to K-bit truncater, the difference signal $S_D$ can be obtained by extracting the last K bits of the output of the M-bit ADC 202.

The noise shaping block 212, coupled to the first subtractor 210, may perform noise shaping on the difference signal $S_D$ to form the shaped noise signal $S_P$.

The second subtractor 214, coupled to the adder 206 and the noise shaping block 212, may subtract the shaped noise signal $S_P$ from the added signal $S_2'$ to output the noise cancelled signal $S_Y$, but the present invention is not limited thereto. In one embodiment, the second subtractor 214 can be disposed at output node of the accumulator 112 to subtract the shaped noise signal $S_P$ from the output of the accumulator 112.

For better illustration of the noise cancellation operation of the noise canceller 110 under the $2^{nd}$ order FDC PLL structure, related quantization noises at nodes N1 to N6 are approximately modeled as follows, under certain conditions where the frequency is out of the bandwidth of the FDC PLL or the FOG is open-looped (given that the z-domain transfer functions of the noise shaping block 212 and the digital block 118 are $(1-z^{-1})^2$ and $(2-z^{-1})$, respectively:

$$Q_{N1}=-\alpha \cdot z^{-1/2}+Q_2 \cdot (-2z^{-1}+z^{-2})(1-z^{-1})+Q_1 \cdot (-2z^{-1}+z^{-2})+Q_1 \quad (eq2)$$

$$Q_{N2}=-\alpha \cdot z^{-1/2}+Q_2 \cdot (1-z^{-1})^3+Q_1 \cdot (1-z^{-1})^2 \quad (eq3)$$

$$Q_{N3}=Q_2 \cdot (1-z^{-1}) \quad (eq4)$$

$$Q_{N4}=Q_2 \cdot (1-z^{-1})^3 \quad (eq5)$$

$$Q_{N5}=Q_2 \cdot (1-z^{-1})^3+Q_1 \cdot (1-z^{-1})^2 \quad (eq6)$$

$$Q_{N6}=Q_1 \cdot (1-z^{-1})^2 \quad (eq7)$$

where $Q_{N1}$ to $Q_{N6}$ are modeled quantization noises at nodes N1 to N6, respectively, $Q_1$ is the quantization noise of the M-bit ADC 202, and $Q_2$ is the M-bit to K-bit quantizer 204. As can be seen form the equations eq5 and eq6, the modeled quantization noise $Q_{N4}$ only contains a $Q_2$ term, which is shaped the same as the $Q_2$ term in $Q_{N5}$. Thus, after subtraction, the Q2 term can be cancelled at the output of the noise canceller 110, and the quantization noise introduced by the B-bit to K-bit quantizer 204 can then be eliminated. At this time, the output quantization noise of the noise canceller 110 is only dominated by the M-bit ADC 202, as shown in equation eq7, and can be significantly reduced by improving the resolution of the M-bit ADC 202.

Figure 3:
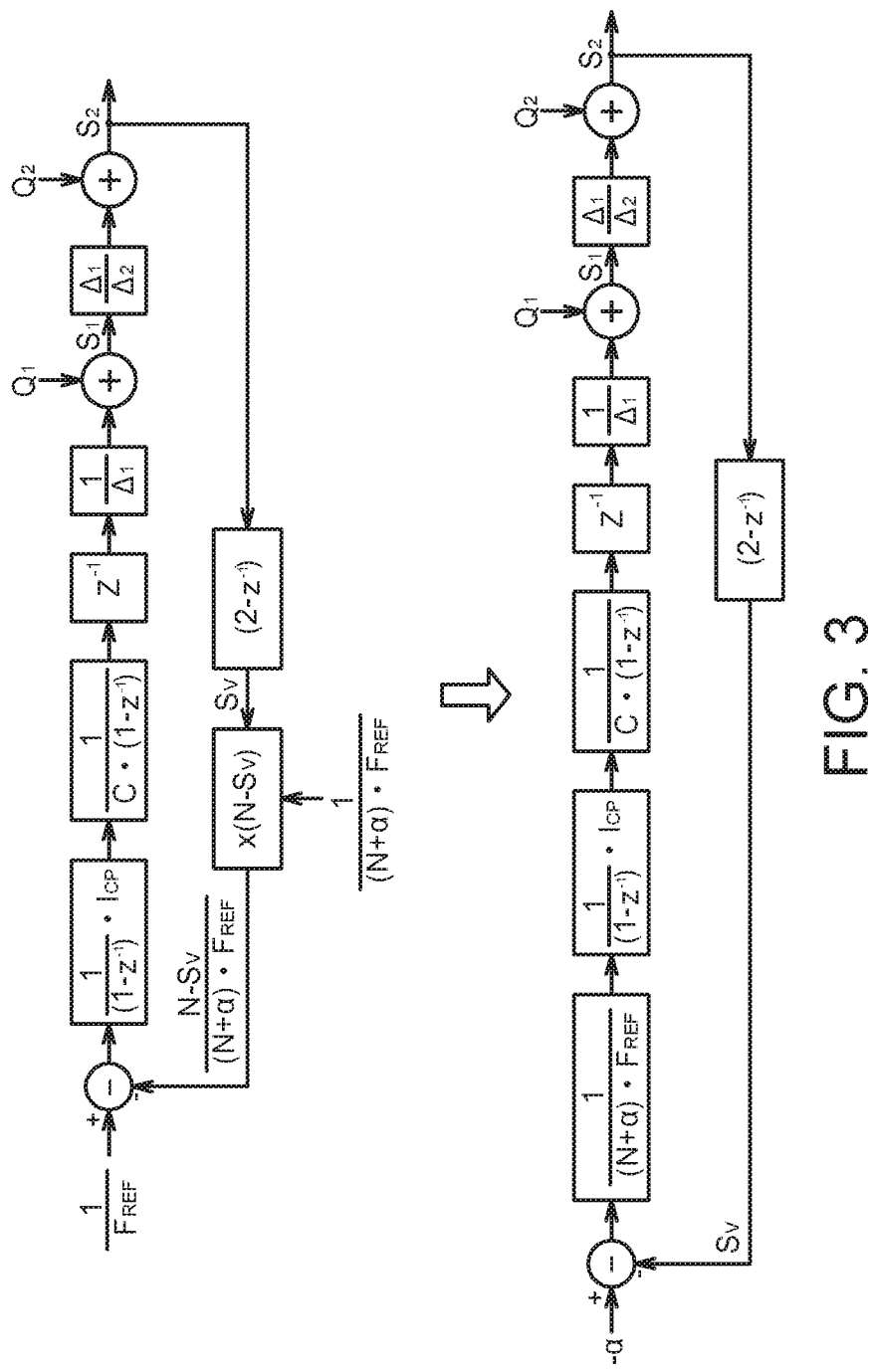
FIG. 3 shows an equivalent model of the FDC.

FIG. 3 shows an equivalent model of the FDC 10, given that the z-domain transfer function of the digital block 118 is $2-z^{-1}$. Given that the frequency multiplication of the output oscillating signal $S_{OUT}$ is $(N+\alpha)$, the equivalent model of the FDC 10 can be remodeled into the one shown in bottom side of the figure.

$$\text{If } I_{CP}=(N+\alpha)F_{REF}C\Delta_2 \quad (eq8)$$

and the FDC is open-looped, where $I_{CP}$ is the current of the charge pump 104 and is the capacitance of the capacitor 106, the transfer function of the quantization noise of the M-bit to K-bit quantizer 204 to the output of the FDC 10 can be written as:

$$\frac{S_2}{Q_2}=(1-Z^{-1})^2. \quad (eq\ 9)$$

According to equations eq8 and eq9, the noise canceler 110 can then be implemented, wherein the transfer function of the noise shaping block 212 is chosen the same as the equation eq9.

In some cases, the current of the charge pump 104, the capacitance of the capacitor 106, the resolution of the M-bit ADC 202 and/or the resolution of the M-bit to K-bit quantizer 204 may vary in response to the temperature and/or process variation. Thus, in some embodiments of the present invention, a background calibrator is employed to compensate for the variations, such that the equation eq8 is tenable for any sample time.

Figure 4:
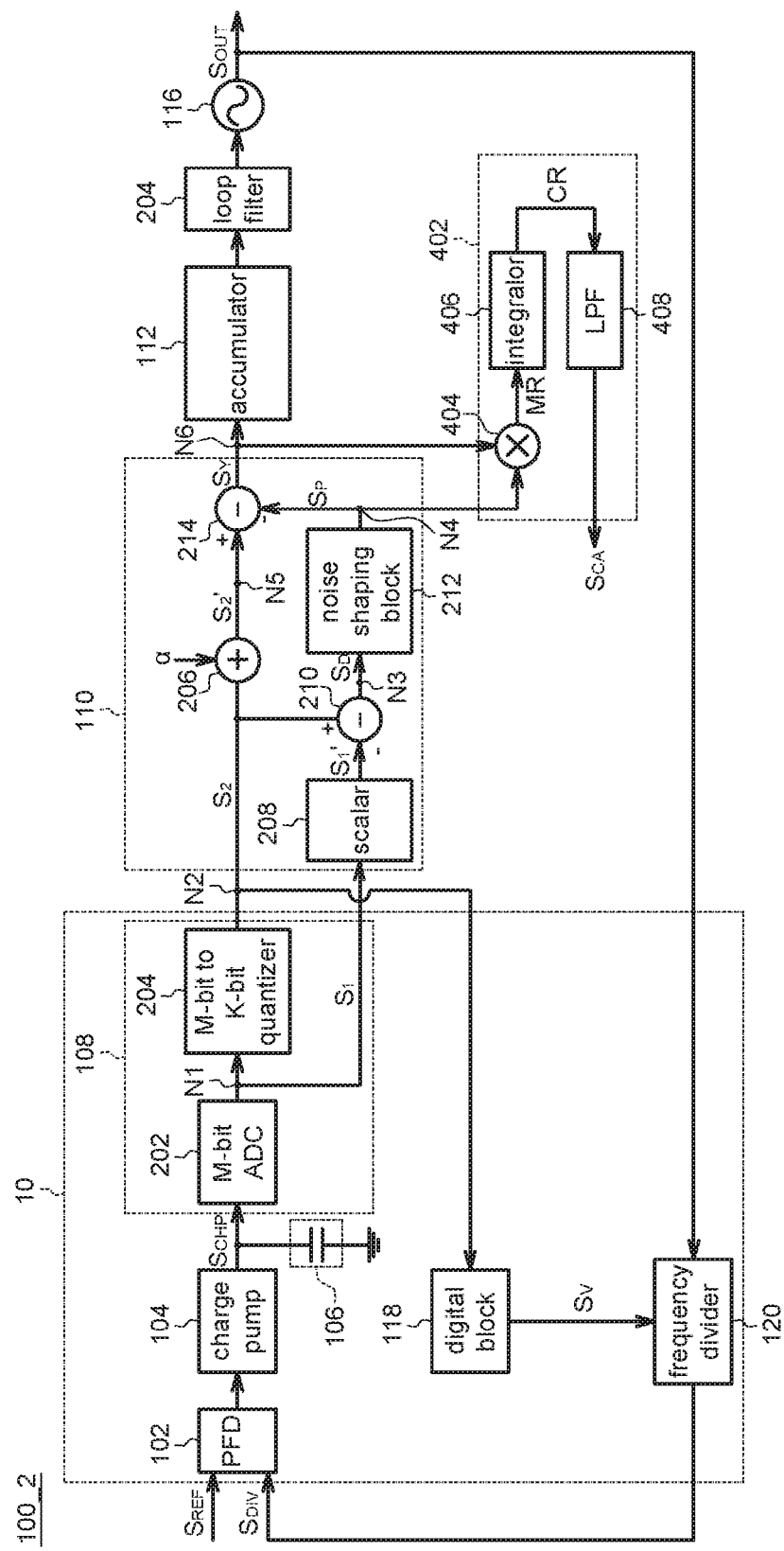
FIG. 4 shows a block diagram of a PLL according to an embodiment of the present invention.

FIG. 4 shows a block diagram of a PLL 100_2 according to an embodiment of the present invention. Compared to the previous embodiments, the PLL 100_2 further includes a background calibrator 402.

The background calibrator 402, coupled to the noise canceller 110, may adjust the component parameter of any one component in the FDC 10 (e.g., the charge pump 104, the capacitor 106, the M-bit ADC 202 and the M-bit ADC 202), such that the correlation of the shaped noise signal $S_P$ and the noise cancelled signal $S_Y$ approaches to zero. The component parameters may include, for example, the charge pump current $I_{CP}$, the capacitance C of the capacitor 106, the resolution of the M-bit ADC 202 and the resolution of the M-bit to K-bit quantizer 204. For example, the background calibrator 402 may adjust the capacitance of the capacitor 106 such that the correlation of the shaped noise signal $S_P$ and the noise cancelled signal $S_Y$ approaches to zero.

The zero correlation between the shaped noise signal $S_P$ and the noise cancelled signal $S_Y$ means that the output of the noise canceler 110, i.e., the noise cancelled signal $S_Y$, has no information of the quantization noise of the M-bit to K-bit quantizer 204 within it. In such case, the equation eq8 is tenable, so that the noise canceller 110 performs the noise cancellation operation effectively.

The background calibrator 402 includes a multiplier 404, an integrator 406 and a low pass filter (LPF) 408. The multiplier 404, coupled to the noise canceller 110, receives the shaped noise signal $S_P$ and the noise cancelled signal $S_Y$ and multiplies them to generate a multiplied result MR. The integrator 406, coupled to the multiplier 404, integrates the multiplied result $S_M$ to obtain a correlation result CR of the shaped noise signal $S_P$ and the noise cancelled signal $S_Y$. The LPF 408, coupled to the integrator 406, filters the correlation result CR to generate a calibration signal $S_{CA}$ to adjust the one or more component parameters. For example, the capacitance C of the capacitor 106 may change in response to the calibration signal $S_{CA}$ until the correlation of the shaped noise signal $S_P$ and the noise cancelled signal $S_Y$ reaches to zero, such that the equation eq8 is tenable.

In another embodiment, the LPF 408 can be omitted. In this situation, the background calibrator 402 may adjust the component parameters (e.g., the capacitance C of the capacitor 106) directly with the correlation result CR.

In yet another embodiment, the background calibrator 402 may calibrate the component parameter(s) according to the difference between the output values of the M-bit ADC 202 obtained at different time instances. Specifically, by using equation eq8, the output value of the M-bit ADC 202 at a first time instance can be written as:

$$T_\varepsilon \frac{I_{CP}}{C\Delta_2} = T_\varepsilon \cdot Fref(N+\alpha) \cdot 2^6 \cdot \psi \quad (eq\ 10)$$

where $T_\varepsilon$ is the phase difference between the reference signal $S_{REF}$ and the second digital signal $S_2$, and $\psi$ is the mismatch caused by the component parameter(s).

The output value of the M-bit ADC 202 at a second time instance can be written as:

$$T_\varepsilon \frac{I_{CP}}{C\Delta_2} + \left[\frac{N-V_n}{Fref(N+\alpha)} - \frac{N+\alpha}{Fref(N+\alpha)}\right] \quad (eq\ 11)$$

$$\frac{I_{CP}}{C\Delta_2} = [T_\varepsilon \cdot Fref(N+\alpha) \cdot 2^6 + (-V_n - \alpha) \cdot 2^6] \cdot \psi$$

And, the difference between equations eq10 and eq11 can be written as $(-V_n-\alpha) \cdot 2^6 \cdot \psi$.

Since $V_n$ and $\alpha$ are known parameters, the mismatch of the component parameter(s), $\psi$, can then be obtained. The Obtained mismatch information can be provided to the background calibrator 402 to perform subsequent calibration operations.

Figure 5:
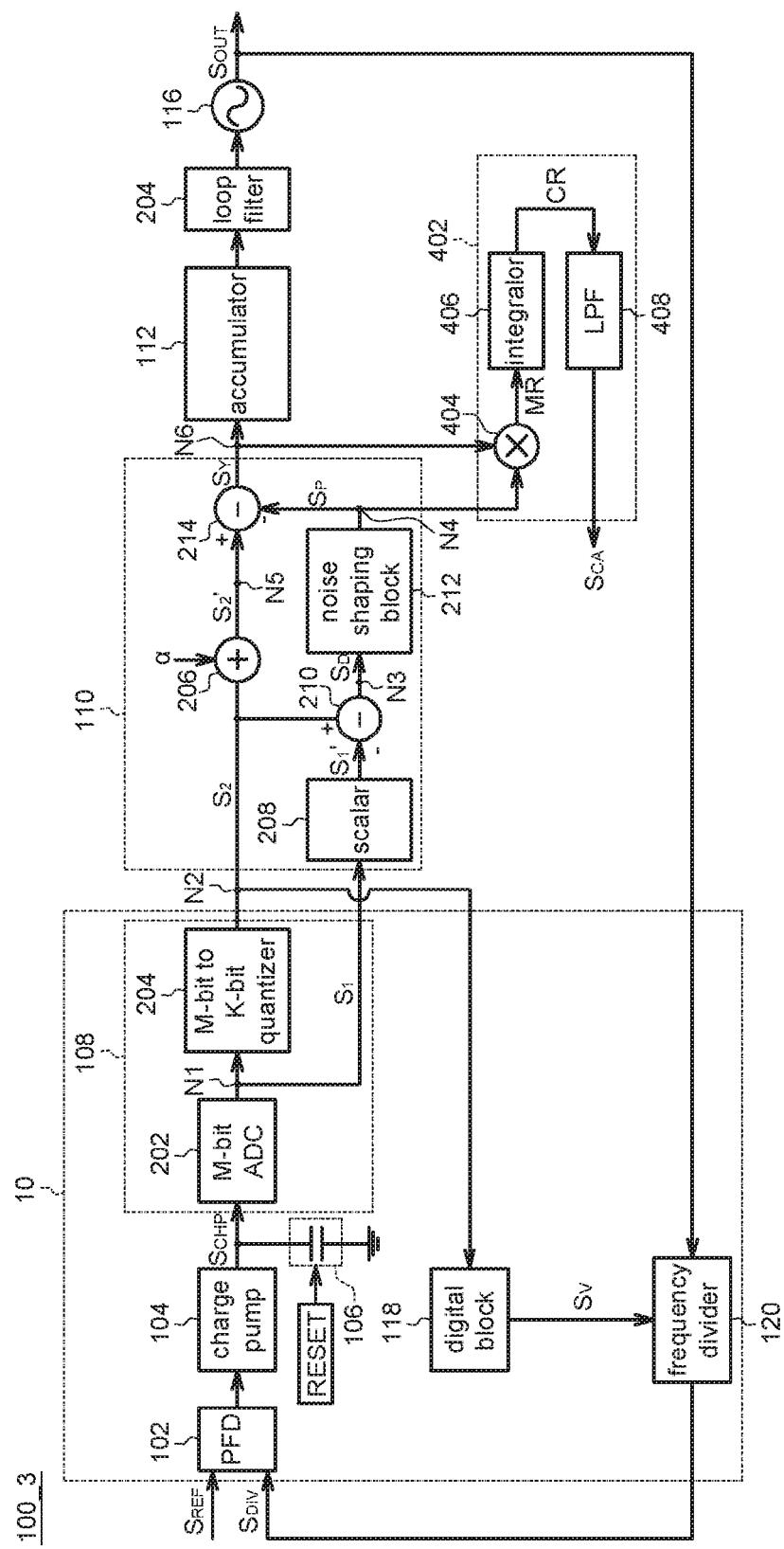
FIG. 5 shows a block diagram of a PLL according to an embodiment of the present invention.

FIG. 5 shows a block diagram of a PLL 100_3 according to an embodiment of the present invention. The PLL 100_3 is similar to the previous embodiments, except that the PLL 100_3 is specific to a 1$^{st}$ order FDC PLL structure. The PLL 100_3 can be implemented with/without the background calibrator 402.

Compared to the 2$^{nd}$ order FDC PLL structure, in PLL 100_3, the z-domain transfer functions of the digital block 118 and the noise shaping block 212 are 1 and $(1-z^{-1})$, respectively. Further, the voltage on the capacitor 106 may reset to an initial value every operating cycle in response to a reset signal RESET. Thus, the transfer function of the capacitor 106 can be changed to 1/C.

For better illustration of the noise cancellation mechanism of the PLL 100_3, related quantization noises at nodes N1 to N6 can be approximately modeled as follows, under certain conditions where the frequency is out of the bandwidth of the FDC PLL or the FDC is open-looped:

$$Q_{N1}' = -\alpha \cdot z^{-1/2} + Q_2 z^{-1} Q_1 \cdot (-1 z^{-1}) \quad (eq12)$$

$$Q_{N2}'^\alpha = -\alpha \cdot z^{-1/2} + Q_2 \cdot (1-z^{-1}) + Q_1 \cdot (1-z^{-1})^2 \quad (eq13)$$

$$Q_{N3}' = Q_2 \quad (eq14)$$

$$Q_{N4}' = Q_2 \cdot (1-z^{-1}) \quad (eq15)$$

$$Q_{N5}' = Q_2 \cdot (1-z^{-1}) + Q_1 \cdot (1-z^{-1}) \quad (eq16)$$

$$Q_{N6}' = Q_1 \cdot (1-z^{-1}) \quad (eq17)$$

where $Q_{N2}'$ to $Q_{N6}'$ are modeled quantization noises at nodes N1 to N6 of the PLL 100_3, respectively. As can be seen form the equations eq15 and eq16, the modeled quantization noise $Q_{N4}'$ only remains a $Q_2$ term, which is shaped the same as the $Q_2$ term in $Q_{N5}'$. Thus, after subtraction, the Q2 term can be cancelled at the output of the noise canceller 110, and the quantization noise introduced by the M-bit to K-bit quantizer 204 can then be eliminated.

In some embodiments, the presented PLL may utilize a phase interpolator to reduce the output quantization noise.

Figure 6:
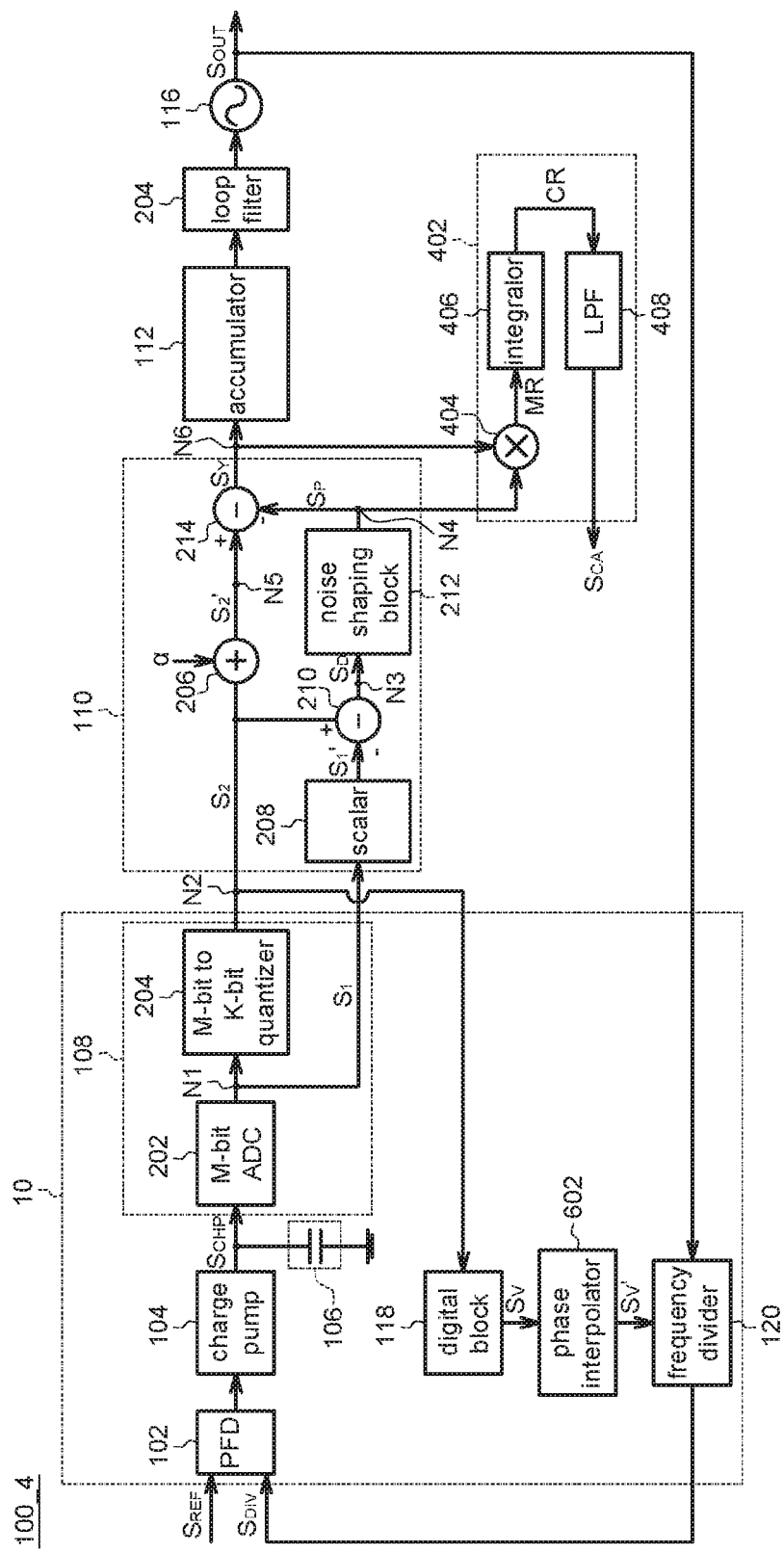
FIG. 6 shows a block diagram of a PLL according to an embodiment of the present invention.

FIG. 6 shows a block diagram of a PLL 100_4 according to an embodiment of the present invention. Compared to the previous embodiments, the PLL 1002 further includes a phase interpolator 602. The PLL 100_4 can be implemented with/without the background calibrator 402.

As shown in FIG. 6, the phase interpolator 602 is coupled to the digital block 118, for performing phase interpolation on the divider modulus control signal $S_V$ to provide a phase interpolated signal $S_V'$ to the frequency divider 120.

The transfer function of the phase interpolator 602 can be written as $$\frac{1}{K},$$

where K is a constant number, and the following equation is tenable, $$I_{CP} = (N+\alpha) F_{REF} C \Delta_2 \cdot K. \quad (eq18)$$

At this time, under certain conditions where the frequency is out of the bandwidth of the FDC PLL or the FDC is open-looped, the output signal of the FDC 10 can be expressed as follows:

$$FDC\_out = -\alpha \left( \frac{\frac{1}{1-z^{-1}} \cdot \frac{z^{-1}}{1-z^{-1}} \cdot K}{1 + \frac{1}{1-z^{-1}} \cdot \frac{z^{-1}}{1-z^{-1}} \cdot H_{DB}} \right) + \quad (eq\ 19)$$

$$Q \left( \frac{1}{1 + \frac{1}{1-z^{-1}} \cdot \frac{z^{-1}}{1-z^{-1}} \cdot H_{DB}} \right),$$

where FDC_out is the output signal (e.g., the second digital signal $S_2$) of the FDC 10, $H_{DB}$ is the transfer function of the digital block 118, and Q is the quantization noise of the ADC 108/M-bit to K-bit quantizer 204. As can be seen from the equation eq19, due to the phase interpolator 602, the signal transfer function (FDC_out/$-\alpha$) is K times more than the one without using the phase interpolator 602, while the noise transfer the function (FDC_out/Q) still remains the same. Thus, the quantization noise introduced by the ADC 108 can be reduced.

Based on the above, the proposed PLL may employ a high resolution ADC to suppress the quantization noise component of the PLL's phase noise and utilizes a lower resolution quantizer to provide the lower resolution output for the frequency divider. The quantization noise introduced by the low resolution quantizer can be cancelled by the noise canceller. Thus, the noise of the PLL can be significantly reduced, and the operation bandwidth of the PLL can be widened. Moreover, a background calibrator is employed to compensate for the variations caused by the temperature and/or process variation, such that the noise canceller works effectively.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A phase lock loop (PLL), comprising:
    a phase frequency detector (PFD), for detecting a phase difference between a reference signal and a divided signal;
    a charge pump, coupled to the PFD, for providing a charge pump signal;
    a capacitor, coupled to the charge pump;
    an analog-to-digital convertor (ADC), coupled to the capacitor, for converting the charge pump signal to a first digital signal, and quantizing the first digital signal to a second digital signal;
    a noise canceller, coupled to the ADC, for forming a shaped noise signal according to the first and second digital signals, and eliminating the shaped noise signal at an output of the noise canceller to generate a noise cancelled signal, wherein the noise canceller performs noise shaping to a difference between the second digital signal and a scaled first digital signal to form the shaped noise signal;
    an accumulator, coupled to the noise canceller, for accumulating the noise cancelled signal to output an accumulated signal;
    a loop filter, coupled to the accumulator, for outputting a filtered signal in response to the accumulated signal;
    an oscillator, coupled to the loop filter, for providing an output oscillating signal in response to the filtered signal;
    a digital block, coupled to the ADC, for converting the second digital signal to a divider modulus control signal; and
    a frequency divider, coupled to the oscillator and the digital block, for dividing the frequency of the output oscillating signal according to the divider modulus control signal to generate the divided signal.

2. The PLL according to claim 1, wherein the first digital signal is a digital signal with M-bit resolution, and the second digital signal is another digital signal with K-bit resolution, where K and M are integers and K is less than or equal to M.

3. The PLL according to claim 1, wherein the ADC comprises:
a M-bit ADC, for converting the charge pump signal to the first digital signal with a resolution of M-bit; and
a M-bit to K-bit quantizer, for quantizing the first digital signal to the second digital signal with a resolution of K-bit, wherein K and M are integers and K is less than or equal to M.

4. The PLL according to claim 3, wherein the M-bit to K-bit quantizer is a delta-sigma modulator (DSM) or a truncater.

5. The PLL according to claim 1, wherein the noise canceller comprises:
an adder, coupled to the ADC, for adding a frequency control parameter into the second digital signal to generate an added signal, wherein the frequency control parameter is corresponding to a fractional part of a frequency multiplication of the output oscillating signal;
a scalar, coupled to the ADC, for scaling the first digital signal to generate a scaled first digital signal;
a first subtractor, coupled to the scalar and the ADC, for subtracting the scaled first digital signal from the second digital signal to generate a difference signal;
a noise shaping block, coupled to the first subtractor, for performing noise shaping on the difference signal to form the shaped noise signal; and
a second subtractor, coupled to the adder and the noise shaping block, for subtracting the shaped noise signal from the added signal to output the noise cancelled signal.

6. The PLL according to claim 1, wherein the z-domain transfer function of the noise shaping block is $(1-z^{-1})^2$, and the z-domain transfer function of the digital block is $(2-z^{-1})$, where z is a complex number.

7. The PLL according to claim 1, wherein the z-domain transfer function of the noise shaping block is $(1-z^{-1})$, and the z-domain transfer function of the digital block is 1, where z is a complex number.

8. The PLL according to claim 7, wherein the voltage on the capacitor resets to an initial value every operating cycle in response to a reset signal.

9. The PLL according to claim 1, further comprising:
a background calibrator, coupled to the noise canceller, for adjusting one or more component parameters of at least one of the charge pump, the capacitor and the ADC, such that a correlation of the shaped noise signal and the noise cancelled signal approaches to zero.

10. The PLL according to claim 9, wherein the background calibrator comprises:
a multiplier, coupled to the noise canceller, for multiplying the shaped noise signal and the noise cancelled signal to generate a multiplied result;
an integrator, for integrating the multiplied result to obtain a correlation result of the shaped noise signal and the noise cancelled signal; and
a low pass filter (LPF), coupled to the integrator, for filtering the correlation result to generate a calibration signal to adjust the one or more component parameters.

11. The PLL according to claim 1, further comprising:
a phase interpolator, coupled to the digital block, performing phase interpolation on the divider modulus control signal to provide a phase interpolated signal to the frequency divider.

12. A phase lock loop (PLL), comprising:
a phase frequency detector (PFD), for detecting a phase difference between a reference signal and a divided signal;
a charge pump, coupled to the PFD, for providing a charge pump signal;
a capacitor, coupled to the charge pump, wherein the voltage on the capacitor resets to an initial value every operating cycle in response to a reset signal;
an analog-to-digital convertor (ADC), coupled to the capacitor, for converting the charge pump signal to a first digital signal, and quantizing the first digital signal to a second digital signal;
a noise canceller, coupled to the ADC, for forming a shaped noise signal according to the first and second digital signals, and eliminating the shaped noise signal at an output of the noise canceller to generate a noise cancelled signal;
an accumulator, coupled to the noise canceller, for accumulating the noise cancelled signal to output an accumulated signal;
a loop filter, coupled to the accumulator, for outputting a filtered signal in response to the accumulated signal;
an oscillator, coupled to the loop filter, for providing an output oscillating signal in response to the filtered signal;
a digital block, coupled to the ADC, for converting the second digital signal to a divider modulus control signal with a z-domain transfer function of 1; and
a frequency divider, coupled to the oscillator and the digital block, for dividing the frequency of the output oscillating signal according to the divider modulus control signal to generate the divided signal.

13. The PLL according to claim 12, wherein the first digital signal is a digital signal with M-bit resolution, and the second digital signal is another digital signal with K-bit resolution, where K and M are integers and K is less than or equal to M.

14. The PLL according to claim 12, wherein the noise canceller performs noise shaping to a difference between the second digital signal and a scaled first digital signal to form the shaped noise signal.

15. The PLL according to claim 12, wherein the ADC comprises:
a M-bit ADC, for converting the charge pump signal to the first digital signal with a resolution of M-bit; and
a M-bit to K-bit quantizer, for quantizing the first digital signal to the second digital signal with a resolution of K-bit, wherein K and M are integers and K is less than or equal to M.

16. The PLL according to claim 12, wherein the noise canceller comprises:
an adder, coupled to the ADC, for adding a frequency control parameter into the second digital signal to generate an added signal, wherein the frequency control parameter is corresponding to a fractional part of a frequency multiplication of the output oscillating signal;
a scalar, coupled to the ADC, for scaling the first digital signal to generate a scaled first digital signal;

a first subtractor, coupled to the scalar and the ADC, for subtracting the scaled first digital signal from the second digital signal to generate a difference signal;

a noise shaping block, coupled to the first subtractor, for performing noise shaping with a z-domain transfer function of $(1-z^{-1})$ on the difference signal to form the shaped noise signal; and a second subtractor, coupled to the adder and the noise shaping block, for subtracting the shaped noise signal from the added signal to output the noise cancelled signal.

17. The PLL according to claim 12, further comprising:
a background calibrator, coupled to the noise canceller, for adjusting one or more component parameters of at least one of the charge pump, the capacitor and the ADC, such that a correlation of the shaped noise signal and the noise cancelled signal approaches to zero.

18. The PLL according to claim 17, wherein the background calibrator comprises:
a multiplier, coupled to the noise canceller, for multiplying the shaped noise signal and the noise cancelled signal to generate a multiplied result;

an integrator, for integrating the multiplied result to obtain a correlation result of the shaped noise signal and the noise cancelled signal; and a low pass filter (LPF), coupled to the integrator, for filtering the correlation result to generate a calibration signal to adjust the one or more component parameters.

19. The PLL according to claim 12, further comprising:
a phase interpolator, coupled to the digital block, performing phase interpolation on the divider modulus control signal to provide a phase interpolated signal to the frequency divider.

* * * * *